(12) United States Patent
Kerner et al.

(10) Patent No.: US 8,582,420 B2
(45) Date of Patent: Nov. 12, 2013

(54) TIME DOMAIN SIGNAL GENERATION

(75) Inventors: Michael Kerner, Netanya (IL);
Vladimir Kravtsov, Jerusalem (IL);
Tom Harel, Shfaim (IL)

(73) Assignee: Intel Corporation, Santa Clara, CA (US)

( * ) Notice: Subject to any disclaimer, the term of this patent is extended or adjusted under 35 U.S.C. 154(b) by 293 days.

(21) Appl. No.: 13/075,107

(22) Filed: Mar. 29, 2011

(65) Prior Publication Data

US 2012/0250589 A1    Oct. 4, 2012

(51) Int. Cl.
*H04J 11/00* (2006.01)

(52) U.S. Cl.
USPC .......................................................... 370/210

(58) Field of Classification Search
None
See application file for complete search history.

(56) References Cited

U.S. PATENT DOCUMENTS

| | | | | |
|---|---|---|---|---|
| 2001/0037351 | A1* | 11/2001 | Hellberg | 708/313 |
| 2007/0156800 | A1* | 7/2007 | Sturza et al. | 708/300 |
| 2007/0183308 | A1* | 8/2007 | Korobkov et al. | 370/208 |
| 2007/0273567 | A1* | 11/2007 | LaMarche | 341/144 |
| 2008/0273583 | A1 | 11/2008 | Song et al. | |
| 2009/0109919 | A1* | 4/2009 | Bertrand et al. | 370/330 |
| 2009/0245422 | A1 | 10/2009 | Sampath et al. | |
| 2012/0063554 | A1* | 3/2012 | Smith | 375/350 |
| 2012/0314804 | A1* | 12/2012 | Dakshinamurthy et al. | 375/295 |

FOREIGN PATENT DOCUMENTS

KR    10-2011-0012537 A    2/2011

OTHER PUBLICATIONS

Singh et al., "Digital Up Converter for WiMax System," Engg Journals Publication, IJEST, International Journal of Engineering Science and Technology, vol. 2(9), 2010, pp. 4570-4574.
International Search Report and Written Opinion mailed Oct. 12, 2012 from International Application No. PCT/US2012/026347.
Sesia et al., "LTE-The UMTS Long Term Evolution from Theory to Practice," Wiley, A John Wiley and Sons, Ltd, Publication, Section 19.5.1, 2009.
"3rd Generation Partnership Project; Technical Specification Group Radio Access Network; Evolved Universal Terrestrial Radio Access (E-UTRA); Physical channels and modulation," 3GPP TS 36.21 V10.0.0, Release 10, Dec. 2010, LTE Advanced.

* cited by examiner

*Primary Examiner* — Anh-Vu Ly
(74) *Attorney, Agent, or Firm* — Schwabe, Williamson & Wyatt, P.C.

(57) ABSTRACT

Embodiments of apparatuses, articles, methods, and systems for efficient generation of a time domain signal in multi-carrier communications are generally described herein. Other embodiments may be described and claimed.

19 Claims, 4 Drawing Sheets

TIME DOMAIN SIGNAL GENERATION

FIELD

Embodiments of the present invention relate generally to the field of wireless transmission, and more particularly, to efficient generation of a time domain signal in multi-carrier communications.

BACKGROUND

Multi-carrier communications may include one or more channels as control channels. For example, the 3GPP Long Term Evolution ("LTE") Release 8 (September 2009) standard provides that user equipment ("UE") generate a physical random access channel ("PRACH").

A PRACH may include a preamble with an expected or target length. One way of generating a PRACH is to provide an inverse fast Fourier transform ("IFFT") engine capable of handling an input having an expected or target length of 24,576 samples. For reference, the maximum IFFT input size for other signals may only be 2,048 samples. Implementation of this method in silicon may not be trivial.

Another way of generating a PRACH is to use a hybrid frequency/time generation scheme. According to this scheme, a length of the PRACH signal at the input of the IFFT engine may be the same as for other signals. Complementary signal processing may then be applied in the time domain on the IFFT output to achieve the expected preamble length.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

As used herein, reference to an "element" may refer to a hardware, a software, and/or a firmware element employed to obtain a desired outcome. Although only a given number of discrete elements may be illustrated and/or described, such elements may nonetheless be represented by additional elements or fewer elements without departing from the spirit and scope of embodiments of this disclosure.

Figure 1:
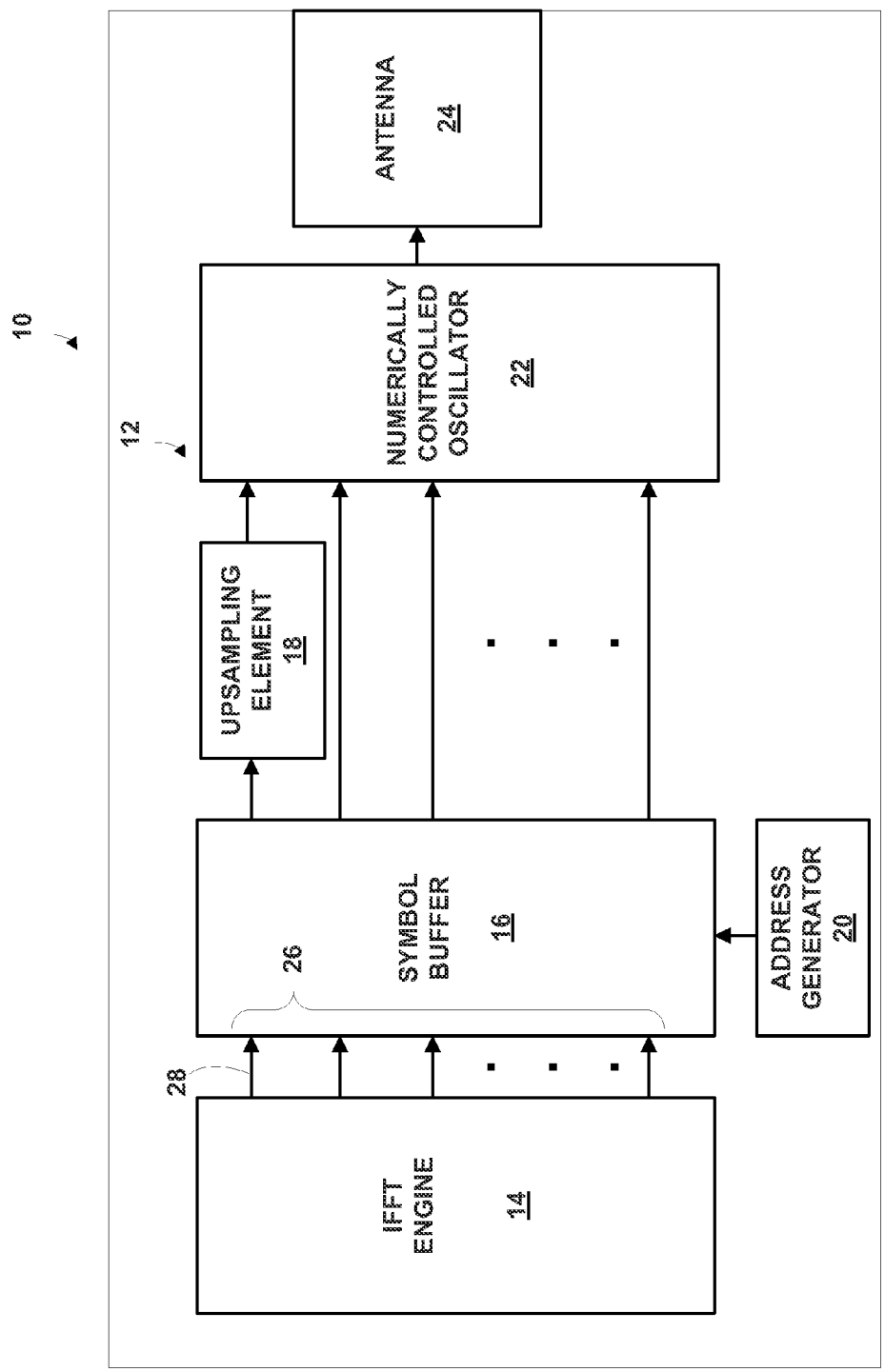
FIG. 1 illustrates a system having a transceiver for transmitting a signal in accordance with some embodiments.

Referring now to FIG. 1, a system 10 for generation of a plurality of channels including a PRACH is shown in accordance with an embodiment. System 10 may be a UE as provided by the LTE standard, such as a cellular telephone or a smart telephone. In some embodiments system 10 has a transceiver 12 that includes a frequency-to-time domain transformer, here in the form of an IFFT engine 14. In some embodiments the IFFT engine 14 may be shared with other channels, and it may support a signal length of up to, e.g., 2048 samples. Transceiver 12 may also include a symbol buffer 16 that may be shared among multiple channels and may be used for buffering and other functions.

An upsampling element 18 is provided to upsample a series of samples output from IFFT engine 14. Upsampling element 18 may support variable upsampling ratios as provided by the LTE standard. Upsampling element 18 may implement a cascade and/or series of filters where all filters are used for a 20 MHz bandwidth signal and subsets are used for other bandwidths. Filtering efficiency provided by the cascaded or series of filters may be increased through the use of half/third band type filters and by implementing polyphase decomposition.

In some embodiments, upsampling element 18 may reduce, either in full (i.e., eliminate) or in part, unwanted edge effects that may be present at a beginning and end of a signal by cyclically interpolating a series of samples. Cyclic interpolation may be implemented by, for instance, linear interpolation of a series of samples, combined with a control block that inserts samples into the series in a cyclic way. In some embodiments, the transceiver 12 may include an address generator 20 coupled with the symbol buffer 16. The address generator 20 may generate addresses in such way that a signal is output from the symbol buffer 16 in a cyclic manner. This may be done to support insertion of cyclic prefixes. Unwanted samples may be removed from transition gaps.

Also included in transceiver 12 is a numerically-controlled oscillator ("NCO") 22 to convert series of samples into a signal. NCO 22 may be responsible for shifting a frequency of the signal. For instance, all channels may be shifted by ½ carrier spacing (carrier spacing=15 KHz in LTE), and a PRACH may be shifted by ½ carrier spacing plus delta. Delta may be determined from the LTE standard. NCO 22 may output to an antenna 24 for transmission.

System 10 may be used to process a plurality of series of samples 26 for a plurality of channels. However, while multiple series of samples pass through IFFT engine 14, symbol buffer 16 and NCO 22, the upsampling element 18 may be dedicated to only processing a first series of samples 28. First series of samples 28 may contain control information for all channels. For example, first series of samples may be a PRACH generated by a UE.

In some embodiments, the upsampling element 18 may support various interpolation factors to enable the system 10 to support all configurations defined by the LTE standard and yet still share an IFFT engine among both the PRACH and other channels. These interpolation factors may include, but are not limited to, 0.75, 1.5, 3, 6 and 12.

For example, assume a transmission signal bandwidth of 20 MHz. If a PRACH preamble format of 0 (as defined in the LTE standard) is in use, then the expected sequence length of the PRACH may be 27,744 samples (3,168 samples for a cyclic prefix plus 24,576 samples for the nominal IFFT size). However, the input of an IFFT engine shared between the PRACH and other channels may be shorter—e.g., 264 samples (3,168/12) for the cyclic prefix and 2,048 samples (24,576/12) for the nominal IFFT size—to accommodate the 20 MHz bandwidth. To alter the PRACH signal of length of 2,312 samples (264+2,048) to achieve the expected length of 27,744 samples, the PRACH may be interpolated by a factor of 12 (2,312 samples×12=27,744 samples). Accordingly, upsampling element 18 may be configured to upsample a series of samples from a lower sampling rate (e.g., 2.56 MHz) to a higher sampling rate (e.g., 30.72 MHz) in order to achieve the expected PRACH sequence length.

One manner of upsampling a series of samples in accordance with some embodiments is to pass the series through one or more of a plurality of available interpolation filters in various sequences in order to upsample an input series of samples to an appropriate sampling rate. The appropriate sampling rate and the various sequences of filters may be based on a particular frequency bandwidth available for transmitting information.

Figure 5:
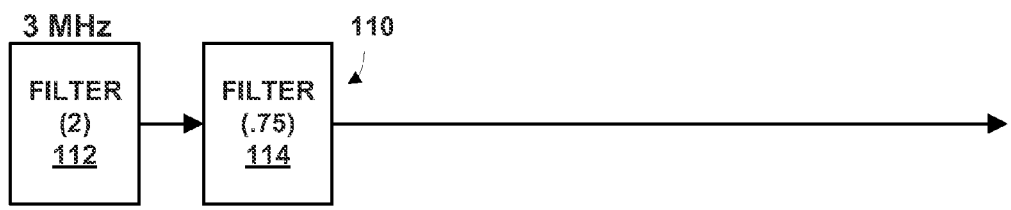
Figure 6:
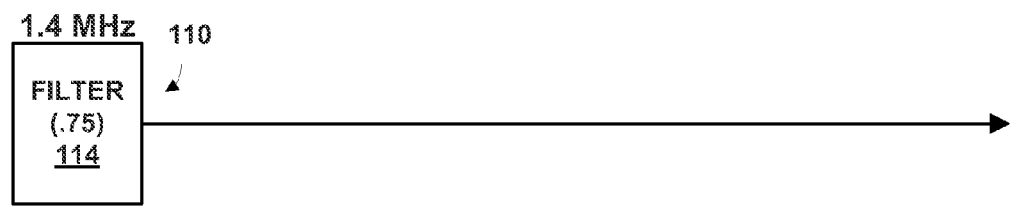
Figure 7:
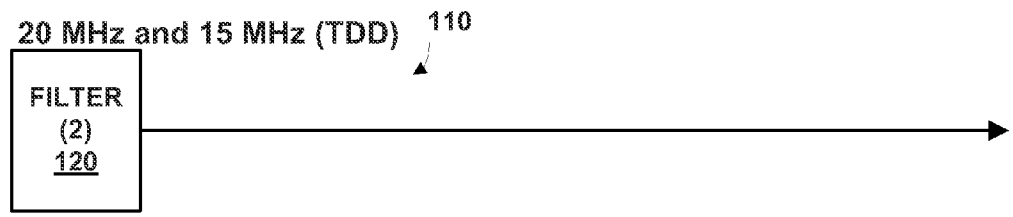

Various sequences of a filter bank 110 are shown in FIGS. 2-7 in accordance with some embodiments. FIGS. 2-6 assume frequency division duplexing ("FDD"). FIG. 7 assumes time division duplexing ("TDD"). A series of samples may be passed through various sequences of one or more of these filters in order to upsample the series of samples for transmission within various bandwidths. In these examples, the sampling rate at the input of the filter bank 110 is 2.56 MHz for FDD and 15.36 MHz for TDD, but it should be understood that other input sampling rates may be used without departing from the scope of the present disclosure. It should also be understood that this particular filter bank 110 is not limiting, and other combinations and/or sequences of filters may be used without departing from the scope of the present disclosure.

Figure 2:
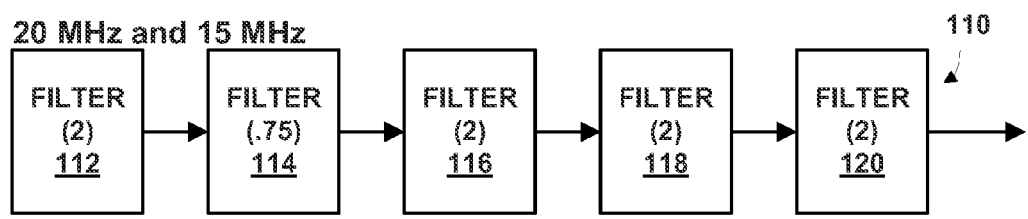
FIGS. 2-7 illustrate various sequences of filters of a filter bank that may be used for upsampling a series of samples to various frequencies in accordance with some embodiments.

A first sequence of filters is shown in FIG. 2 and may be used where a bandwidth of a signal to be output from an NCO (e.g., NCO 22 of FIG. 1) is 20 MHz or 15 MHz. This sequence includes a first interpolation filter 112 with an interpolation factor of 2, a second interpolation filter 114 with an interpolation factor of 0.75, a third interpolation filter 116 with an interpolation factor of 2, a fourth interpolation filter 118 with an interpolation factor of 2, and a fifth interpolation filter 120 with an interpolation factor of 2, yielding a total interpolation factor of 12 (2×0.75×2×2×2=12).

When a series of samples sampled at a sampling rate of 2.56 MHz passes through first interpolation filter 112, the series of samples emerges at a sampling rate of 5.12 MHz (2.56 MHz×interpolation factor of 2=5.12 MHz). When the series of samples at 5.12 MHz passes through second interpolation filter 114 having an interpolation factor of 0.75, the series of samples emerges at a sampling rate of 3.84 MHz. When the series of samples at 3.84 MHz passes through third interpolation filter 116 having an interpolation factor of 2, the series of samples emerges at a sampling rate of 7.68 MHz. When the series of samples at 7.68 MHz passes through fourth interpolation filter 118 having an interpolation factor of 2, the series of samples emerges at a sampling rate of 15.36 MHz. Finally, when the series of samples at 15.36 MHz passes through fifth interpolation filter 120 having an interpolation factor of 2, the series of samples emerges at a sampling rate of 30.72 MHz.

Figure 3:
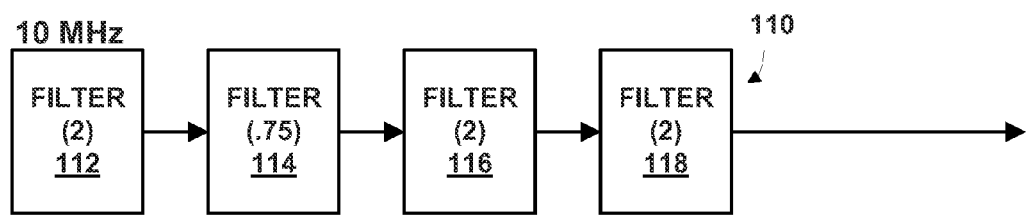

A second sequence of filters from filter bank 110 is shown in FIG. 3 and may be used where a bandwidth of a signal to be output from an NCO (e.g., NCO 22 of FIG. 1) is 10 MHz. This sequence includes first interpolation filter 112, second interpolation filter 114, third interpolation filter 116, and fourth interpolation filter 118, yielding a total interpolation factor of 6 (2×0.75×2×2=6).

When a series of samples sampled at a sampling rate of 2.56 MHz passes through the sequence of filters of FIG. 2, the sampling rate changes are the same as in the sequence of FIG. 1, except that the series of samples is not passed through fifth interpolation filter 120. Thus, when the series of samples emerges from fourth interpolation filter 118, the series has a sampling rate of 15.36 MHz.

Figure 4:
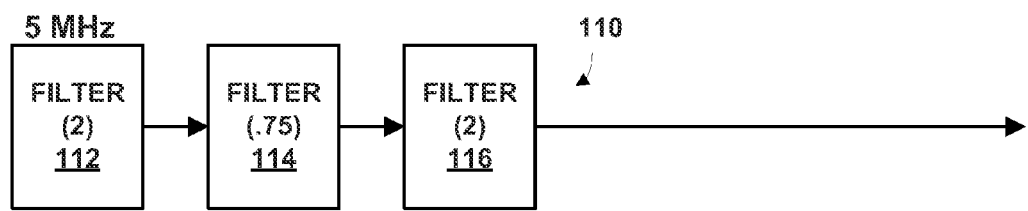

A third sequence of filters is shown in FIG. 4 and may be used where a bandwidth of a signal to be output from an NCO (e.g., NCO 22 of FIG. 1) is 5 MHz. This sequence includes first interpolation filter 112, second interpolation filter 114 and third interpolation filter 116, yielding a total interpolation factor of 3 (2×0.75×2=3). When a series of samples sampled at a sampling rate of 2.56 MHz passes through the sequence of filters of FIG. 4, the sampling rate changes are the same as in FIGS. 2 and 3, except that the series of samples is not passed through fourth or fifth interpolation filters 118 and 120. Thus, when the series of samples emerges from third interpolation filter 116, the series has a sampling rate of 7.68 MHz.

A fourth sequence of filters is shown in FIG. 5 and may used where a bandwidth of a signal to be output from an NCO (e.g., NCO 22 of FIG. 1) is 3 MHz. This sequence includes first interpolation filter 112 and second interpolation filter 114, yielding a total interpolation factor of 1.5 (2×0.75=1.5). When a series of samples sampled at a sampling rate of 2.56 MHz passes through the sequence of filters of FIG. 5, the sampling rate changes are the same as in previously described sequences, except that the series of samples is not passed through third, fourth or fifth interpolation filters 116, 118 and 120. Thus, when the series of samples emerges from second interpolation filter 114, the series has a sampling rate of 3.84 MHz.

For a bandwidth of a signal to be output from an NCO (e.g., NCO 22 of FIG. 1) of 1.4 MHz, a fifth sequence of filters is shown in FIG. 6 and only includes second interpolation filter 114 with an interpolation factor of 0.75. Thus, a series of samples sampled at a sampling rate of 2.56 MHz emerges from second interpolation filter 114 with a sampling rate of 1.92 MHz.

Another sequence of filters is shown in FIG. 7, and assumes the transmitting device uses TDD, rather than FDD as have the aforementioned sequences. The bandwidth of the signal transmitted by the TDD device is 20 MHz or 15 MHz. A series of samples input to such a device at 15.36 MHz may be passed through a filter having an interpolation factor of 2, such as fifth interpolating filter 120, to increase its sampling rate to 30.72 MHz.

The above-described sequences of filters are efficient because a higher sampling frequency at an input of the filter allows for the reduction of filter taps. Thus, filters located closer to the beginning of the cascade of filters may be implemented with less filter taps. For example, the number of taps in the fifth interpolating filter 120 in the sequence of filters of FIG. 2 (20 MHz or 15 MHz) is minimal, at only two taps.

The interpolation filters described above may be implemented in various ways to achieve various levels of efficiency. For example, first interpolation filter 112, third interpolation filter 116, fourth interpolation filter 118 and fifth interpolation filter 120 may be implemented using half-band type filters. Every second coefficient in this type of filter is equal to zero, thus reducing the overall complexity of the filters. Similarly, second interpolation filter 114 may be implemented by choosing a third-band type filter. Every third coefficient in this type of filter is equal to zero, thus reducing the overall complexity of the filters.

Additionally, one or more filters may be implemented using polyphase decomposition. Polyphase decomposition allows reduction of a large finite impulse response filter with M taps into set of smaller sub-filters having a number of taps=M/interpolation factor. For instance, two sub-filters may be used in the case of factor 2 interpolation, and three sub-filters may be used in case of factor 3 interpolation. This allows for the reduction of storage requirements by a factor of two for half-band type filters, because every second coefficient is equal to zero and thus the second sub-filter is degenerated—and by a factor of one third for third-band type filters.

Figure 8:
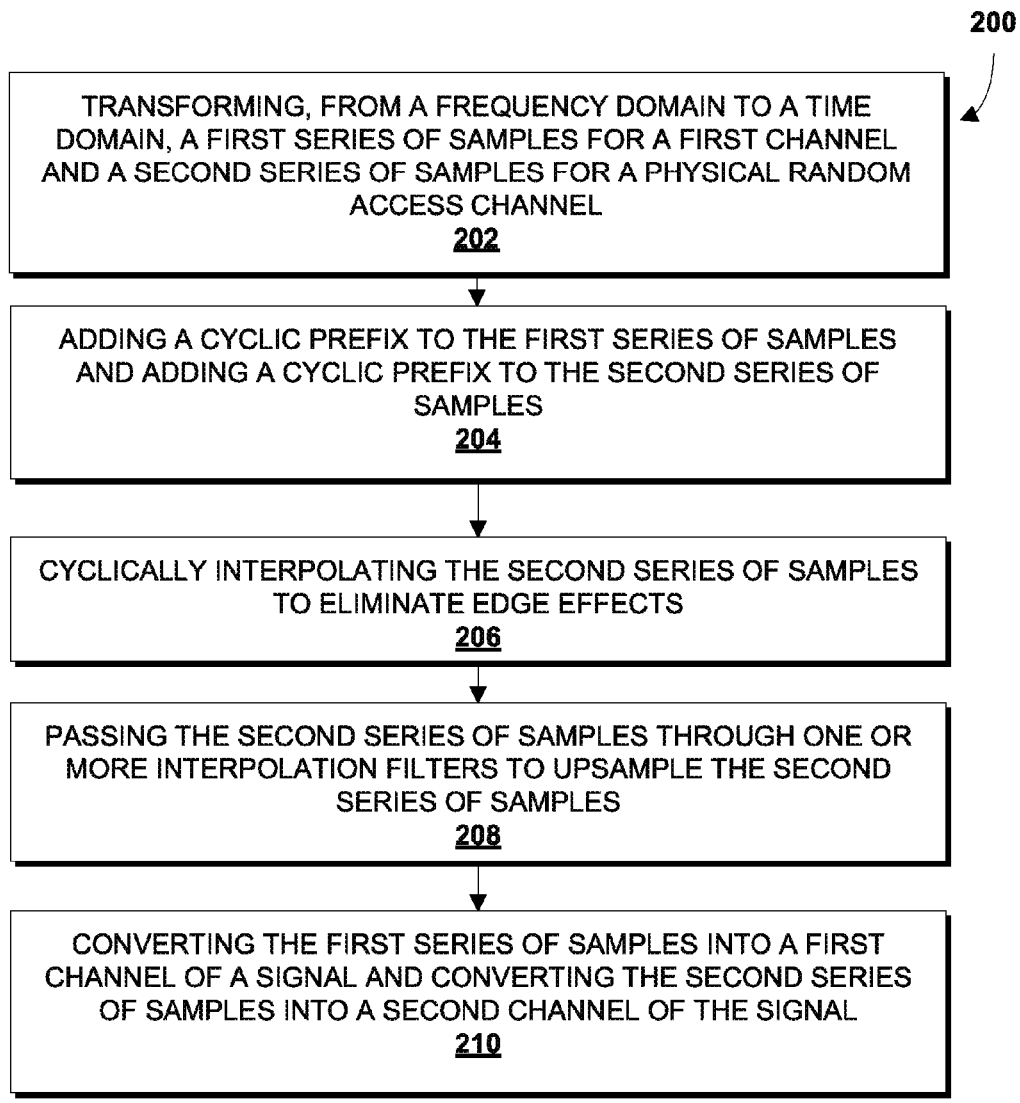
FIG. 8 illustrates a method of implementing a PRACH in accordance with various embodiments.

FIG. 8 depicts a method 200 of implementing a PRACH according to some embodiments. At 202, a first series of samples for a first channel and a second series of samples for a PRACH are transformed from a frequency domain to a time domain. At 204, a cyclic prefix is added to the first and second series of samples, in order to reduce, in full or in part, inter-symbol interference. At 206, the second series of samples (i.e., PRACH) is cyclically interpolated to reduce edge effects. At 208, the second series of samples is passed through one or more interpolation filters to upsample the second series of samples, as described above. At 210, the first series of samples is converted into a first channel of a signal and the second series of samples is converted into a second channel of the signal. The second channel of the signal may be the PRACH.

While the examples described above involve generation of a PRACH, this is not meant to be limiting, and other types of signals may be generated in accordance with the present disclosure. For example, disclosed methods may be used to generate a ranging signal for the IEEE 802.16 standard, IEEE Std. 802.16-2009, published May 29, 2009.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:
1. A transceiver comprising:
an inverse fast Fourier transformation engine to transform, from a frequency domain to a time domain, a first series of samples for a first channel and a second series of samples for a second channel that is a physical random access channel or a ranging channel;
a hardware or firmware upsampling element to cyclically interpolate the second series of samples to reduce edge effects; and
a plurality of interpolation filters to upsample the second series of samples,
wherein the plurality of interpolation filters includes:
a first interpolation filter with an interpolation factor of 2; and
a second interpolation filter with an interpolation factor of 0.75.
2. The transceiver of claim 1, wherein the plurality of interpolation filters further includes:
a third interpolation filter with an interpolation factor of 2;
a fourth interpolation filter with an interpolation factor of 2; and
a fifth interpolation filter with an interpolation factor of 2,
wherein the plurality of interpolation filters are arranged in an ordered sequence comprising the first interpolation filter, the second interpolation filter, the third interpolation filter, the fourth interpolation filter, and the fifth interpolation filter.
3. The transceiver of claim 2, wherein the second series of samples is passed through all the plurality of interpolation filters, when the transceiver is configured to operate at a bandwidth of 20 MHz or 15 MHz.
4. The transceiver of claim 2, wherein the second series of samples is passed through the first through fourth interpolation filters, when the transceiver is configured to operate at a bandwidth of 10 MHz.
5. The transceiver of claim 2, wherein the second series of samples is passed through the first through third interpolation filters, when the transceiver is configured to operate at a bandwidth of 5 MHz.
6. The transceiver of claim 1, wherein the second series of samples is passed through the first and second interpolation filters, when the transceiver is configured to operate at a bandwidth of 3 MHz.
7. The transceiver of claim 1, wherein the second series of samples is passed through the second interpolation filter, when the transceiver is configured to operate at a bandwidth of 1.4 MHz.
8. The transceiver of claim 1, wherein the second series of samples is passed through the first interpolation filter when the transceiver is configured to operate at a bandwidth of 20 MHz or 15 MHz, and the transceiver uses time division duplexing.
9. The transceiver of claim 1, further comprising a numerically-controlled oscillator to convert the first series of samples into the first channel, and convert the second series of samples into the second channel.
10. The transceiver of claim 1, further comprising a symbol buffer to add a cyclic prefix to the first and second series of samples.
11. The transceiver of claim 1, wherein at least some of the interpolation filters are half-band filters.
12. The transceiver of claim 1, wherein at least one of the interpolation filters is a third-band filter.
13. The transceiver of claim 1, wherein the plurality of interpolation filters are implemented using polyphase decomposition.
14. A method for implementing a physical random access channel comprising:
transforming, from a frequency domain to a time domain, a first series of samples for a first channel and a second series of samples for the physical random access channel; and
passing the second series of samples through one or more interpolation filters to upsample the second series of samples, wherein the one or more interpolation filters are selected from a plurality of available interpolation filters based on a frequency bandwidth available for transmitting information; and wherein passing the second series of samples through one or more interpolation filters to upsample the second series of samples comprises, where a bandwidth of a signal is 3 MHz, passing the second series of samples through:
- a first interpolation filter with an interpolation factor of 2; and
- a second interpolation filter with an interpolation factor of 0.75.

15. The method of claim 14, wherein passing the second series of samples through one or more interpolation filters to upsample the second series of samples comprises, where a bandwidth of a signal is 20 MHz or 15 MHz, passing the second series of samples through:
- the first interpolation filter with an interpolation factor of 2;
- the second interpolation filter with an interpolation factor of 0.75;
- a third interpolation filter with an interpolation factor of 2;
- a fourth interpolation filter with an interpolation factor of 2; and
- a fifth interpolation filter with an interpolation factor of 2.

16. The method of claim 14, wherein passing the second series of samples through one or more interpolation filters to upsample the second series of samples comprises, where a bandwidth of a signal is 10 MHz, passing the second series of samples through:
- the first interpolation filter with an interpolation factor of 2;
- the second interpolation filter with an interpolation factor of 0.75;
- a third interpolation filter with an interpolation factor of 2; and
- a fourth interpolation filter with an interpolation factor of 2.

17. The method of claim 14, wherein passing the second series of samples through one or more interpolation filters to upsample the second series of samples comprises, where a bandwidth of a signal is 5 MHz, passing the second series of samples through:
- the first interpolation filter with an interpolation factor of 2;
- the second interpolation filter with an interpolation factor of 0.75; and
- a third interpolation filter with an interpolation factor of 2.

18. A system configured to transmit signals, the system comprising:
- an antenna; and
- a hardware or firmware upsampling element configured to:
  - receive a series of samples in a time domain;
  - cyclically interpolate the series of samples to reduce edge effects; and
  - utilize one or more filters of a filter bank to upsample the series of samples after they are interpolated,
- wherein the filter bank includes a first interpolation filter with an interpolation factor of 2 and a second interpolation filter with an interpolation factor of 0.75.

19. The system of claim 18, wherein the filter bank further includes:
- a third interpolation filter with an interpolation factor of 2;
- a fourth interpolation filter with an interpolation factor of 2; and
- a fifth interpolation filter with an interpolation factor of 2.

* * * * *